United States Patent
Sassano et al.

(10) Patent No.: US 12,059,781 B2
(45) Date of Patent: Aug. 13, 2024

(54) COMPONENT LATCH RELEASE ADJUSTABLE HANDLE

(71) Applicant: International Business Machines Corporation, Armonk, NY (US)

(72) Inventors: Camillo Sassano, Durham, NC (US); Kevin L. Schultz, Raleigh, NC (US); Aaron Cox, Sherman, CT (US)

(73) Assignee: International Business Machines Corporation, Armonk, NY (US)

( * ) Notice: Subject to any disclaimer, the term of this patent is extended or adjusted under 35 U.S.C. 154(b) by 459 days.

(21) Appl. No.: 17/363,177

(22) Filed: Jun. 30, 2021

(65) Prior Publication Data

US 2023/0001550 A1    Jan. 5, 2023

(51) Int. Cl.
*H05K 7/14* (2006.01)
*B25B 25/00* (2006.01)
*B25B 27/00* (2006.01)

(52) U.S. Cl.
CPC .............. *B25B 27/00* (2013.01); *B25B 25/00* (2013.01); *H05K 7/1415* (2013.01)

(58) Field of Classification Search
CPC .. H05K 7/1411; H05K 7/1415; H05K 7/1447; H05K 7/1449; H05K 7/1452; H05K 7/1454

See application file for complete search history.

(56) References Cited

U.S. PATENT DOCUMENTS

| | | | |
|---|---|---|---|
| 6,398,569 B1 * | 6/2002 | Boyd | H01R 13/633 439/258 |
| 7,314,384 B2 * | 1/2008 | Togami | G02B 6/4261 439/484 |
| 7,588,373 B1 * | 9/2009 | Sato | G02B 6/3893 385/59 |
| 8,235,745 B1 * | 8/2012 | Armstrong | H01R 13/633 439/352 |
| 8,556,645 B2 * | 10/2013 | Crain | H01R 13/633 438/258 |
| 8,747,141 B2 * | 6/2014 | Crain | H01R 13/6272 439/258 |
| 9,570,852 B2 * | 2/2017 | Plamondon | H01R 24/64 |
| 10,215,935 B2 * | 2/2019 | Scherer | G02B 6/36 |
| 10,405,453 B1 | 9/2019 | Cunningham | |
| 10,732,364 B2 * | 8/2020 | Scherer | H04Q 1/136 |
| 11,304,501 B1 * | 4/2022 | Doan | A44B 19/34 |
| 11,330,882 B1 * | 5/2022 | Doan | A45F 3/02 |

(Continued)

FOREIGN PATENT DOCUMENTS

IN    328215 B    1/2020

*Primary Examiner* — Adrian S Wilson
(74) *Attorney, Agent, or Firm* — Nicholas A. Welling

(57) ABSTRACT

In an approach to a one-handed removable component (RC) extraction, a fixed length strap and a variable length strap, based on a configurable diameter loop in the variable length strap, are attached to each other. The variable length loop passes through the RC extraction handle and encircles a RC release lever. The fixed length strap is attached to the RC extraction handle. The loop diameter is calibrated such that pulling on the fixed length strap first applies force to the variable length loop engaging the release handle, in a direction perpendicular to the applied force, without damage before transferring force to the fixed length strap to extract the RC.

20 Claims, 3 Drawing Sheets

(56) References Cited

U.S. PATENT DOCUMENTS

| | | | |
|---|---|---|---|
| 11,646,532 B1* | 5/2023 | Beard | H01R 13/633 439/344 |
| 2008/0127461 A1* | 6/2008 | Linden | A45F 5/02 24/302 |
| 2009/0275228 A1* | 11/2009 | Henry | H01R 13/6272 439/352 |
| 2019/0069431 A1 | 2/2019 | Kho | |
| 2021/0029845 A1 | 1/2021 | Gundogan | |

* cited by examiner

COMPONENT LATCH RELEASE ADJUSTABLE HANDLE

BACKGROUND

The present disclosure relates generally to the field of removeable components, and more particularly to removeable component latch release operation.

Considering an example, computer server processing centers have standardized on nineteen-inch racks but the components occupying these rack systems come in a wide variety of depths. Further, there are installations where shorter (1 U, i.e., 44.45 mm) systems are sandwiched between deeper systems, making it difficult to access customer replaceable units (CRUs).

Particularly critical are power supplies, based on their use of a latch and safety feature that cannot be operated until the power cable is removed. A 1 U system is a component space too small, especially for larger hands, to reach, making it difficult to operate latches and locks. In these environments, release latches typically operate by pushing a tab sideways, perpendicular to the direction of extraction of the component.

BRIEF SUMMARY

According to an embodiment of the present invention, a method for configuring a one-handed pull strap to a removeable component (RC), the method comprising: attaching a first end of a fixed-length strap to a handle on a RC, wherein the handle is employed to pull the RC from a chassis; encircling a release lever on the RC with a first end of a variable-length strap forming a loop in the first end of the variable-length strap, wherein the variable-length strap is connected to the fixed-length strap; and calibrating the loop diameter such that when pulling on a second end of the fixed-length strap, a pulling force is transferred to the variable-length strap for a distance sufficient to actuate the release lever without damage and then transferring the pulling force to the first end of the fixed length strap to pull the computer rack component from the computer rack.

According to an embodiment of the present invention, an apparatus for a one-handed pull extractor of a removeable component (RC), the apparatus comprising: a first strap with a fixed-length loop in a first end; and a second strap with a first end connected to the first strap, and a fastener for creating a configurable length loop in a second end.

According to an embodiment of the present invention, a system for a one-handed pull extractor of a removeable component (RC) from a RC chassis, the system comprising: a RC chassis; a RC; a first strap with a fixed-length loop in a first end; and a second strap with a first end connected to the first strap, and a fastener for creating a configurable length loop in a second end.

Other aspects and embodiments of the present invention will become apparent from the following detailed description, which, when taken in conjunction with the drawings, illustrate by way of example the principles of the invention.

DETAILED DESCRIPTION

Embodiments described herein provide the capability to combine the two movements of releasing a latch and pulling a removeable component (RC) retained by a manually operated spring-loaded latch (MOSLL), e.g., a customer replaceable unit (CRU) out of a computer chassis, using only one pull-point when the direction of force applied to release the latch and the direction of the force applied to pull the RC from the chassis are effectively perpendicular to each other.

It should be noted that references throughout this specification to features, advantages, or similar language herein do not imply that all the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description, and appended claims, or may be learned by the practice of the invention as set forth hereinafter.

The scope of the present invention is to be determined by the claims. Accordingly, any features, characteristics, advantages, or the like, discussed below in the discussion of embodiments of this specification shall not be taken to mean that such features, characteristics, advantages, or the like are required to practice the present invention as defined by the claims.

Embodiments of the present invention are described with reference to the Figures. It should be noted that although the example embodiments are illustrated as a computer component associated with a computer center, embodiments of the present invention are applicable to any system requiring removable components retained by a manually operated spring-loaded latch.

Figure 1:
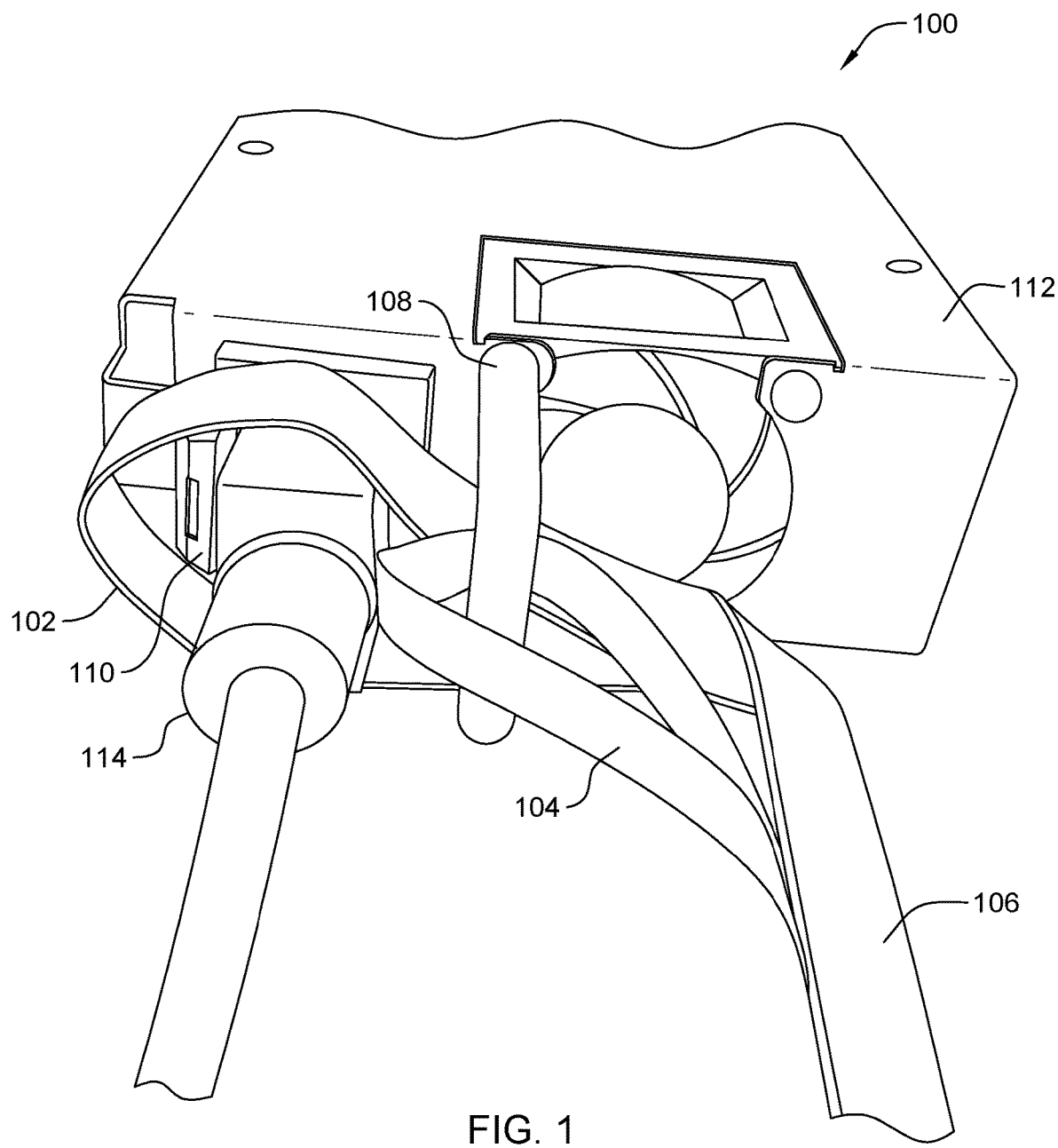
FIG. 1 is a diagram depicting an adjustable length pull handle with a strap attached to a removeable unit, in accordance with at least one embodiment of the present invention.

FIG. 1 is a diagram depicting an embodiment of an adjustable length pull handle 100 attached to a CRU 112. As depicted, the adjustable length pull handle 100 comprises a strap 106 with a loop 102 in at least one end. The loop can be of sufficient diameter to enclose a release latch 110 associated with the CRU 112 and any associated cords 114. It should be noted that the loop 102 is not attached to the release latch 110 and engages the release latch 110 when the adjustable length pull handle 100 is pulled because the release latch 110 is captured within the loop 102. It should further be noted that the cord 114 can be a power cord for providing power to the CRU 112 and the cord 114 can be inserted and removed through the loop 102 while the loop 102 is enclosing both the release latch 110 and the cord 114. The loop 102 can be inserted through a handle 108 attached to the CRU 112 for pulling the CRU 112 out of a CRU chassis. It should be noted that strap 106 and loop 102 travel direction can make approximately a ninety degree change in direction at handle 108, thus directing the pulling force to initially engage the release latch 110.

In another aspect of loop 102, the diameter of loop 102 is configurable based on an attachment location where loop 102 is formed with strap 106. The attachment can be made with hook and look material, snaps, buttons, buckles, or any suitable connectors. For example, sufficient hook and loop connector material can be provided to allow the formed loop to be variable in diameter and adjustable.

Adjustable length pull handle 100 further comprises a strap 104 attached at one end to strap 106 and capable of attaching to either strap 106 or itself, i.e., strap 104, with a hook and loop connecter material, snap, button, buckle, etc. forming a second loop. Strap 104 can be inserted through handle 108 and then attached to itself (strap 104) or strap 106 with the previously described attachment, creating a loop around handle 108. It should be noted that the pulling force is initially applied to the release latch 110 until the free play in the loop created by strap 104 is exhausted and then the pulling force is transferred through strap 104 to handle 108 to extract CRU 112 from the CRU chassis. It should further be noted that strap 104 can have an adjustable loop diameter like loop 102 making either/or loops 102 and 104 adjustable in diameter.

Figure 2:
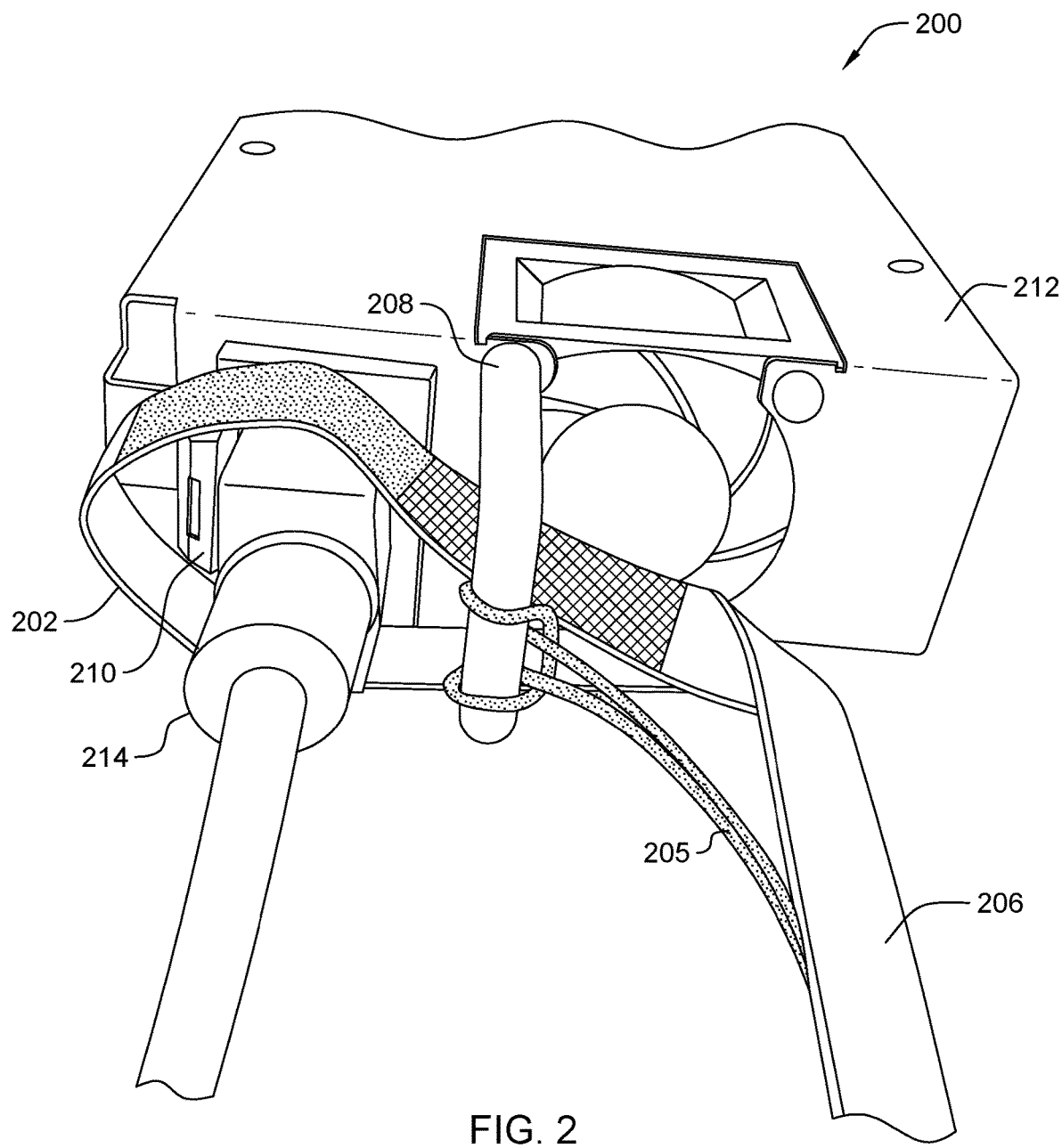
FIG. 2 is a diagram of an adjustable length pull handle with a closed lanyard, i.e., girth hitch, attached to a removeable unit, in accordance with at least one embodiment of the present invention.

Turning now to FIG. 2 and diagram 200 is another embodiment of an adjustable length pull handle 200 attached to a CRU 212. As depicted, the adjustable length pull handle 200 comprises a strap 206 with a loop 202 in at least one end. The loop can be of sufficient diameter to enclose a release latch 210 associated with the CRU 212 and any associated cords 214. It should be noted that the loop 202 is not attached to the release latch 210 and engages the release latch 210 when the adjustable length pull handle 200 is pulled because the release latch 210 can be captured within the loop 202. It should further be noted that the cord 214 can be a power cord for providing power to the CRU 212 and the cord 214 can be inserted and removed through the loop 202 while the loop 202 is enclosing both the release latch 210 and the cord 214. The loop 202 can be inserted through a handle 208 attached to the CRU 212 for pulling the CRU 212 out of a CRU chassis. It should be noted that strap 206 and loop 202 travel direction can make approximately a ninety degree change in direction at handle 208, thus directing the pulling force to initially engage the release latch 210.

In another aspect of loop 202, the diameter of loop 202 is configurable based on an attachment location where loop 202 is formed with strap 206. The attachment can be made with hook-and-loop material, snaps, rivets, buttons, buckles, stitching, or any suitable connectors. For example, sufficient hook and loop connector material can be provided to allow the formed loop to be variable in diameter and adjustable.

In another embodiment, adjustable length pull handle 200 further comprises a lanyard 205 with a loop in both ends or formed as a single loop. A girth hitch is used to attach one end of the lanyard to handle 208. The opposite end of the lanyard is captured in a pull ring, carabiner, etc. (not shown) along with strap 206 and an associated loop (not shown) in the end opposite loop 202. It should be noted that the pulling force is initially applied to the release latch 210 until the free play in the lanyard 205 is exhausted and then the pulling force is transferred through lanyard 205 to handle 208 to extract CRU 212 from the CRU chassis.

Figure 3:
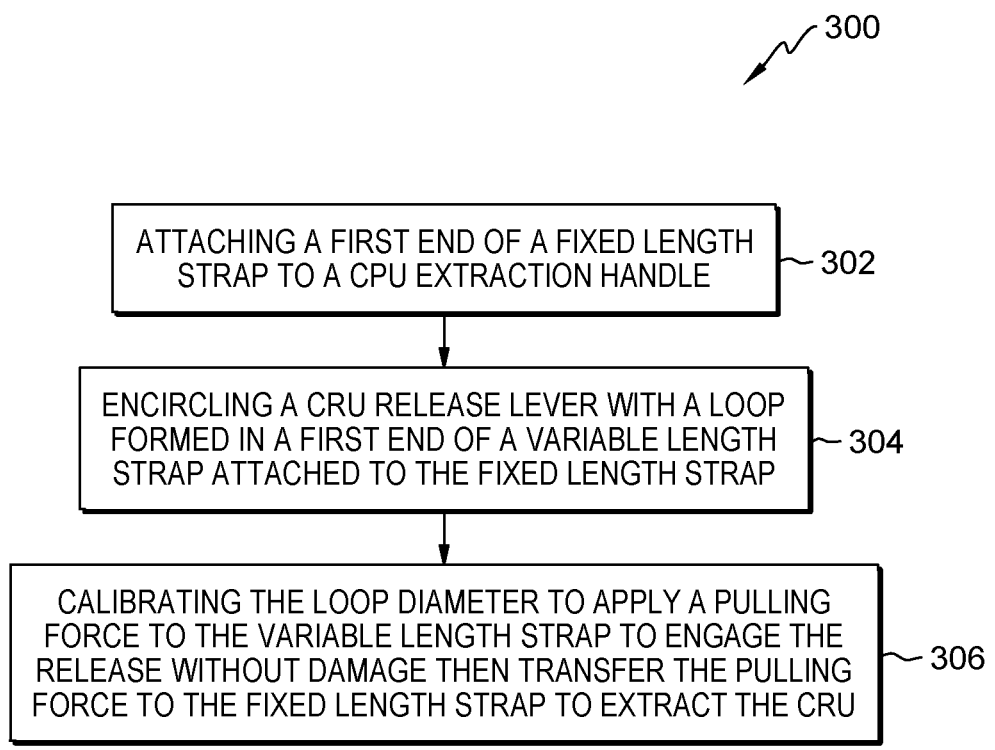
FIG. 3 is a flowchart of a method for configuring and attaching an adjustable length pull handle to a removeable unit, in accordance with at least one embodiment of the present invention.

FIG. 3 is an exemplary flowchart of a method 300 for configuring a one-handed CRU pull-strap. At step 302, an embodiment can attach a first end of a fixed length strap to a CRU extraction handle. At step 304, the embodiment can encircle a CRU release lever with a loop formed in a first end of a variable length strap attached to a fixed length strap. At step 306, the embodiment can calibrate the loop diameter to apply a pulling force to the variable length strap to engage the release lever without damage and then transfer the pulling force to the fixed length strap to extract the CRU.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth to provide a comprehensive understanding of the claimed invention. However, one skilled in the art would understand that various embodiments may be practiced without such specific details.

Although the features and elements of the embodiments disclosed herein are described in combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for configuring a one-handed pull strap to a removeable component (RC), the method comprising:
    attaching a first end of a fixed-length strap to a handle on a RC, wherein the handle is employed to pull the RC from a chassis;
    encircling a release lever on the RC with a first end of a variable-length strap forming a loop in the first end of the variable-length strap, wherein the variable-length strap is connected to the fixed-length strap; and
    calibrating the loop diameter such that when pulling on a second end of the fixed-length strap, a pulling force is transferred to the variable-length strap for a distance sufficient to actuate the release lever without damage and then transferring the pulling force to the first end of the fixed-length strap to pull the RC from a computer rack.

2. The method of claim 1, wherein the variable-length strap is adjusted with a hook-and-loop fastener.

3. The method of claim 1, wherein the second end of the fixed-length strap comprises a loop for pulling.

4. The method of claim 1, wherein the second end of the fixed-length strap comprises a handle for pulling.

5. The method of claim 4, wherein the handle is at least one of a ring or a carabiner.

6. The method of claim 1, wherein the first end of the fixed-length strap is attached to the handle based on the fixed-length strap forming a loop around the handle and attaching to itself.

7. The method of claim 1, wherein the variable-length strap is connected to the fixed-length strap by at least one of a rivet, a button, a snap, stitching, a ring, a carabiner, or a hook-and-loop material.

8. The method of claim 1, wherein the fixed-length strap is a lanyard and the first end is attached to the handle with a girth hitch.

9. The method of claim 8, wherein the second end is connected to the second end of the variable-length strap with at least one of a rivet, a button, a snap, stitching, a ring, a carabiner, or a hook-and-loop material.

10. An apparatus for a one-handed pull extractor of a replaceable component (RC) in a RC chassis, the apparatus comprising:
    a fixed-length strap with a first end attached to a handle on a RC, wherein the handle is employed to pull the RC from a RC chassis; and
    a variable-length strap with a first end encircling a release lever on the RC, forming a loop in the first end of the fixed length strap and connected to the fixed length strap, wherein the loop diameter is calibrated such that when pulling on a second end of the fixed-length strap, a pulling force is transferred to the variable-length strap for a distance sufficient to actuate the release lever without damage and then transferring the pulling force to the first end of the fixed-length strap to pull the RC from a computer rack.

11. The apparatus of claim 10, wherein the fastener is a hook-and-loop fastener.

12. The apparatus of claim 10, wherein the first strap has a fixed-length loop in a second end.

13. The apparatus of claim 10, wherein the first strap has a handle connected to the second end.

14. The apparatus of claim 10, wherein the fixed-length loop is formed with a connector allowing the loop to be opened and closed.

15. The apparatus of claim 10, wherein the first strap is a lanyard with a second loop in a second end.

16. A system for a one-handed pull extractor of a replaceable component (RC) from a RC chassis, the system comprising:
    a RC chassis;
    a RC;
    a first strap with a fixed-length loop in a first end; and
    a second strap with a first end connected to the first strap, and a fastener for creating a configurable length loop in a second end.

17. The system of claim 16, wherein the fastener is a hook-and-loop fastener.

18. The system of claim 16, wherein the first strap has a fixed-length loop in a second end.

19. The system of claim 16, wherein the first strap has a handle connected to the second end and the fixed-length loop is formed with a connector allowing the loop to be opened and closed.

20. The system of claim 16, wherein the first strap is a lanyard with a second loop in a second end.

\* \* \* \* \*